United States Patent
So et al.

(10) Patent No.: US 7,872,875 B2
(45) Date of Patent: Jan. 18, 2011

(54) MOUNTING BOARD, HEIGHT ADJUSTING APPARATUS AND MOUNTING METHOD

(75) Inventors: Tsuyoshi So, Kawasaki (JP); Yoshinori Uzuka, Kawasaki (JP); Osamu Aizawa, Kawasaki (JP); Hideo Kubo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 575 days.

(21) Appl. No.: 11/867,277

(22) Filed: Oct. 4, 2007

(65) Prior Publication Data
US 2008/0158843 A1    Jul. 3, 2008

(30) Foreign Application Priority Data
Dec. 27, 2006    (JP) .............................. 2006-352747

(51) Int. Cl.
*H05K 7/20* (2006.01)
(52) U.S. Cl. .................. 361/770; 361/809; 361/810; 174/138 G; 174/138 E
(58) Field of Classification Search ......... 361/808–810, 361/770, 769, 767; 174/138 G, 166 S, 137 R, 174/138 E, 164
See application file for complete search history.

(56) References Cited

U.S. PATENT DOCUMENTS

| 5,684,677 | A | 11/1997 | Uchida et al. | |
|---|---|---|---|---|
| 5,964,396 | A | 10/1999 | Brofman et al. | |
| 6,688,828 | B1 * | 2/2004 | Post | 411/383 |
| 6,850,411 | B1 * | 2/2005 | Patel | 361/704 |
| 2005/0248026 | A1 * | 11/2005 | So | 257/706 |
| 2008/0079129 | A1 * | 4/2008 | Ganapathysubramanian et al. | 257/678 |

FOREIGN PATENT DOCUMENTS

| JP | 7-74450 A | 3/1995 |
|---|---|---|
| JP | 11-111776 A | 4/1999 |
| JP | 2000-150709 A | 5/2000 |
| JP | 2001-127113 A | 5/2001 |

* cited by examiner

*Primary Examiner*—Dameon E Levi
*Assistant Examiner*—Hoa C Nguyen
(74) *Attorney, Agent, or Firm*—Westerman, Hattori, Daniels & Adrian, LLP

(57) ABSTRACT

An electronic part having mounting terminals made of a thermally-meltable bonding material is mounted on a mounting board. A structural part is used for moving a height-adjusting member to a position under the electronic part in a process of heating and melting the thermally-meltable bonding material so as to maintain a predetermined distance between the electronic part and the mounting board.

7 Claims, 10 Drawing Sheets

MOUNTING BOARD, HEIGHT ADJUSTING APPARATUS AND MOUNTING METHOD

BACKGROUND OF THE INVENTION

1. Field of the Invention

The present invention generally relates to a mounting structure of electronic parts and, more particularly, to a mounting board to which electronic parts are mounted by using external mounting terminals made of a thermally-meltable joining material, a height-adjusting apparatus of such electronic parts, and a mounting method of such electronic parts.

2. Description of the Related Art

Many electronic parts such as semiconductor devices are mounted on a mounting board using mounting terminals (external connection terminals) that are made of a thermally-meltable bonding member such as a solder bump. For example, a BGA (hall grid array) type semiconductor device has many BGA bumps (solder balls) on a mounting surface, and the semiconductor device is mounted on a printed-circuit board by bonding the BGA bumps to electrode pads of the printed-circuit bard.

Figure 1:
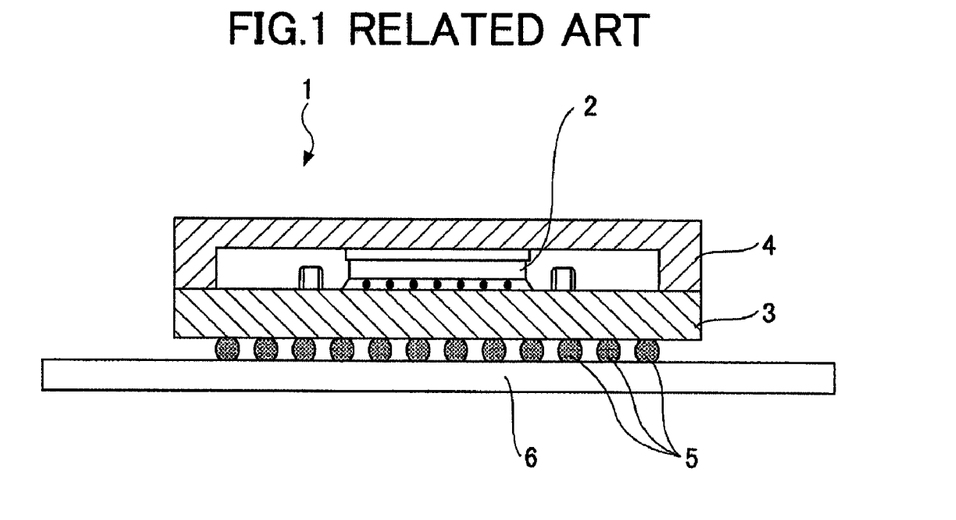
FIG. 1 is a cross-sectional view showing a state where a conventional BGA type semiconductor device is mounted to a printed circuit board.

FIG. 1 is a cross-sectional view showing a state where a conventional BGA type semiconductor device is mounted to a printed circuit board. The semiconductor device 1 comprises a semiconductor chip 2, a package board 3 on which the semiconductor chip 2 is mounted, and a heat spreader 4 provided to cover the semiconductor chip 2. Many BGA bumps (solder ball bumps) 5 as external connection terminals are provided on a mounting surface of the package board 3. The semiconductor device 1 is mounted onto the printed circuit board 6 by heating and melting the BGA bumps 5 while causing the BGA bumps 5 to contact with electrode pads of the printed circuit board 6 and cooling the melted BGA bumps to be solidified.

With the improvement in a performance of electronic equipments, a number of input/output terminals of a semiconductor device is increasing every year. In connection with that, the size (package size) of the semiconductor device has become larger. In association with power on/off of electronic equipments, a temperature of a periphery of the semiconductor device is increased and decreased. If the package board 3 and the printed circuit board 6 have different coefficients of thermal expansion, plastic strain is generated in the BGA bumps 5 after mounting (terminals formed by the solder balls being melted and solidified) due to the difference between the coefficients of thermal expansion. The plastic strain increased with a number of times of power on/off, and if it exceeds a certain limit value, the bumps are destroyed, and, thus, the electronic equipment cannot be operated normally.

If the package size increases, the number of times of power on/off at which the plastic strain reaches the limit value is reduced, and, thus, the service life of the electronic equipment is shortened.

With respect to the decrease in the service life due to the above-mentioned bump destruction, it is known that the limit value of the bump destruction is increased and the service life can be prolonged if a height of the BGA bump is increased. In the conventional example shown in FIG. 1, the height of the BGA bumps 5 after mounting is determined by a surface tension of the solder. If an amount of solder of each BGA bump 5 is increased, the BGA bumps 5 can be higher, but the bump diameter is also increased, which results in a bump short-circuit being occurred easily due to adjacent bumps contacting with each other.

Moreover, in a semiconductor device generating a large amount of heat, a weight of a heat-radiating part such as a heat spreader or the like is increased, which results in an increase in a compression force applied to the BGA bumps. Even if the BGA bumps are extended to be higher, it may be deformed by a compression force due to a weight of the heat-radiating part and the height of the BGA bumps may be decreased.

Figure 2:
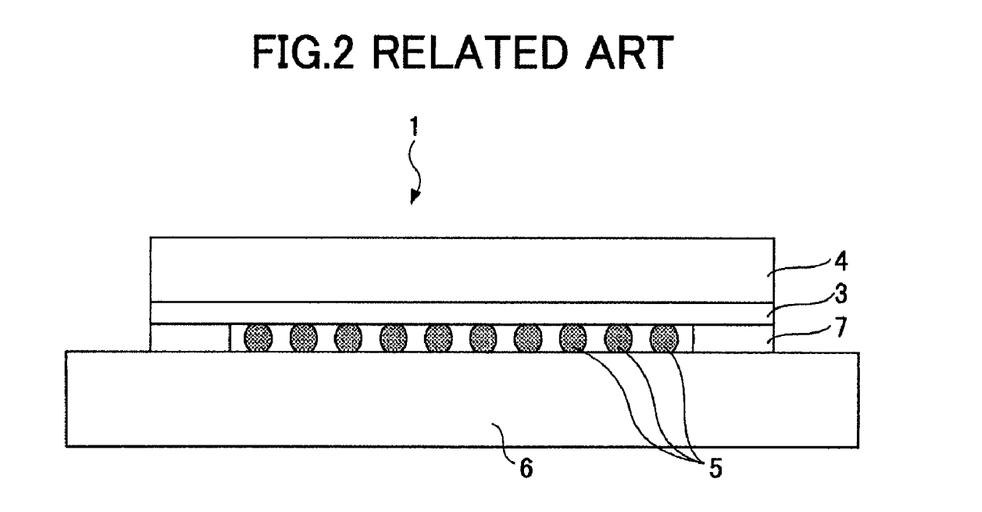
FIG. 2 is a side view of another example of the conventional mounting structure.

Thus, as shown in FIG. 2, the height of the BGA bumps 5 can be changed by changing a height of a standoff 7 by providing the standoff 7 as a spacer between the semiconductor device 1 and the printed circuit bard 6. However, in this case, since the solder balls are melted after the standoff 7 (spacer) is placed, the solder balls attached to the semiconductor device 1, when solder reflow is being performed, may not reach electrode pads of the printed circuit board 6 if a distance between the semiconductor device 1 and the printed circuit board 6 (that is, a height of the spacer) exceeds a certain limit, which may cause a problem in that a so-called open failure occurs.

As a mounting structure similar to the mounting structure shown in FIG. 2, there is suggested a mounting structure that maintains a height of a leadless electronic part to be a constant height by providing a spacer between the leadless electronic part such as a chip resistor or a chip capacitor and a printed circuit board (for example, refer to Patent Document 1).

On the other hand, it is suggested that, in a mutual connecting process of a bard and anther board using solder, a height of solder bumps is increased by lifting one of the boards (separate from the other board) in a state where solder is melted (for example, refer to Patent Document 2).

Moreover, it is suggested that support columns formed of a shape-memory alloy are attached on a mounting surface of a semiconductor device, and the semiconductor device is separated slightly away from a mounting board by using an elongation of the support columns due to heat when solder reflow is performed so as to increase a height of solder bumps (for example, refer to Patent Document 3).

Patent Document 1: Japanese Laid-Open Patent Application No. 7-74450

Patent Document 2: Japanese Laid-Open Patent Application No. 11-111776

Patent Document 3: Japanese Laid-Open Patent Application No. 2000-150709

SUMMARY OF THE INVENTION

It is a general object of the present invention to provide an improved and useful a mounting board for electronic parts in which the above-mentioned problems are eliminated.

A more specific object of the present invention is to provide a mounting board for electronic parts in which a height of a thermally-meltable bonding material can be adjusted easily without providing an additional part to the electronic parts.

Another object of the present invention is to provide a mounting apparatus and method of mounting electronic parts onto a mounting board that can easily adjust a height of a thermally-meltable bonding material without providing an additional part to the electronic parts.

In order to achieve the above-mentioned objects, there is provided according one aspect of the present invention a mounting board onto which an electronic part having mounting terminals made of a thermally-meltable bonding material is mounted, the mounting board comprising: a structural part used for moving a height-adjusting member to a position under the electronic part in a process of heating and melting the thermally-meltable bonding material so as to maintain a predetermined distance between the electronic part and the mounting board.

Additionally, there is provided according to another aspect of the present invention, a height-adjusting apparatus configured to be attached to the above-mentioned mounting board so as to cause the height-adjusting member to move, the height-adjusting apparatus comprising: a deformable member that generates a force to move the height-adjusting member by deformation, wherein the deformable member is formed of a material deforming due to heat when reflowing the mounting terminals of the electronic part.

Further, there is provided according to another aspect of the present invention a mounting method for mounting an electronic part to a mounting board, comprising: attaching a height-adjusting member and a height-adjusting jig to the mounting board; melting mounting terminals of said electronic part by heating the mounting board, and causing the height-adjusting member to move to a position under the electronic part by an action of the height-adjusting jig; and removing the height-adjusting jig from the mounting board while remaining the height-adjusting member after cooling the mounting board.

According to the present invention, the height of the thermally-meltable bonding material can be increased easily in a state where the thermally-meltable bonding material is melted, and, thus, a reliability of a connecting part can be maintained high and a service life of the connecting part can be prolonged. Additionally, since the height-adjusting member remains between the mounted electronic part and the mounting board, there is no case where the thermally-meltable bonding material is compressed and the height thereof is decreased, thereby maintaining a good bonding condition. The height-adjusting member can be formed of a low-cost material, and an influence given to the cost of the electronic part is small.

Other objects features and advantages of the present invention will become more apparent from the following detailed description when read in conjunction with the accompanying drawings.

DETAILED DESCRIPTION OF THE PREFERRED EMBODIMENTS

A description will now be given, with reference to the drawings, of embodiments according to the present invention.

Figure 3:
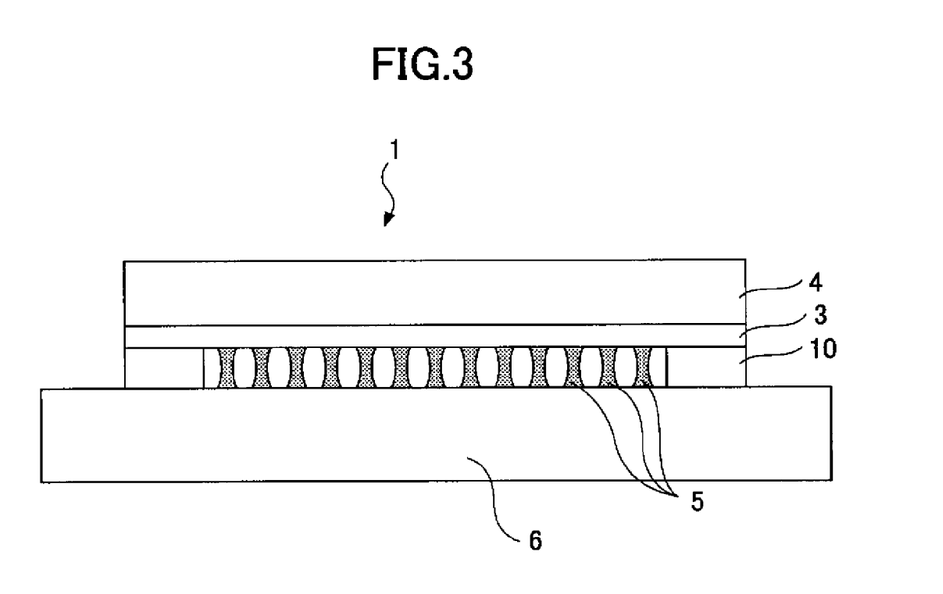
FIG. 3 is a side view showing an outline of a mounting structure of an electronic part according to a mode for carrying out the present invention.

FIG. 3 is a side view showing an outline of a mounting structure of an electronic part according to a mode for carrying out the present invention. In the mode for carrying out the present invention, when mounting a BGA type semiconductor device 1, which is an electronic part, to a printed circuit board 6, which is a mounting board, the BGA bumps 5 are stretched to increase their height in a state where the BGA bumps 5 as mounting terminals are melted in a reflow process. Then, a standoff 10 is provided as a height-retaining member between a semiconductor device 1 and a printed circuit board 6 so as to maintain the state where the height of the BGA bumps 5 is increased.

In the mounting structure according to the mode for carrying out the present invention, the BGA bumps 5 as mounting terminals made of a thermally-meltable bonding material is melted first, and then their height is increased by lifting up the semiconductor device 1 to stretch upward. On the other hand, in the conventional mounting structure shown in FIG. 2, the BGA bumps 5 having an increased height are obtained by previously placing the standoff 7 (spacer) between the semiconductor device 1 and the printed circuit board 6 before melting the BGA bumps 5. In the case of the conventional mounting structure, an open failure tends to occur as mentioned above. On the other hand, by stretching the BGA bumps 5 in the state where the melted BGA bumps 5 are in contact with the electrodes of the semiconductor device 1 and the electrode pads of the printed circuit board 6 as in the mode for carrying out the present invention, the height of the BGA bumps can be increased without causing an open failure and without increasing an amount of the thermally-meltable bonding material of each BGA bump 5. Additionally, by providing the standoff 10, the height of the BGA bumps 5 can be maintained without the BGA bumps 5 being compressed. Thus, both a reliability obtained by the high BGA bumps and a long service life of a bonded part and a strength against an external force (a force applied to the semiconductor device 1 from above) can be provided.

A description will now be given of a mounting board, a height-adjusting apparatus and a mounting method according to a first embodiment of the present invention.

In the mounting method according to the first embodiment of the present invention, a screw screwed into the printed circuit board 6 to extend through the printed circuit board 6 is used as the standoff 10 shown in FIG. 3. The screw is arranged to protrude from a mounting surface 6a by extending through the printed circuit board 6. A protruding part of the screw corresponds to the standoff 10 as a height-adjusting member. When reflowing the BGA bumps 5 made of a thermally-meltable bonding material such as solder, the screw is turned by a predetermined angle in a state where the BGA bumps 5 are melted. Thereby, an end of the protruding part of the screw contacts the semiconductor device 1 and the semiconductor device 1 is lifted up. A distance of the lift of the semiconductor device 1 is determined by the rotation angle of the screw.

Figure 4A:
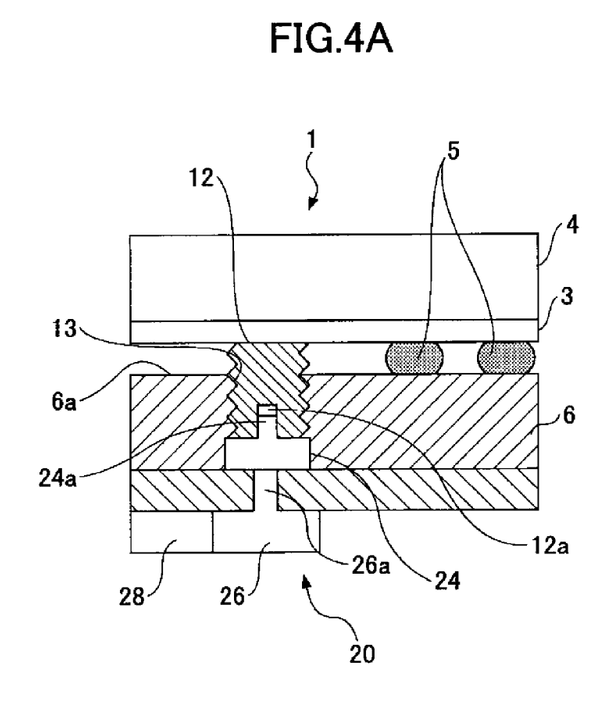
FIG. 4A is a cross-sectional view showing a part provided with a screw in a state before the screw is turned to lift a semiconductor device.
Figure 4B:
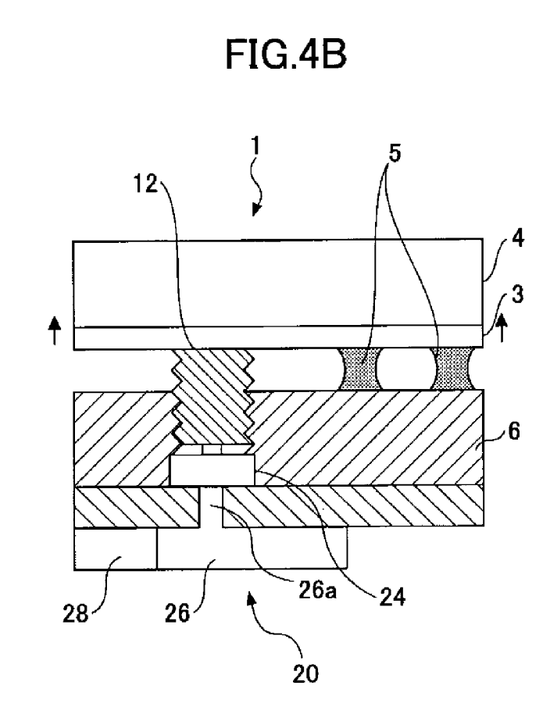
FIG. 4B is a cross-sectional view showing a part provided with a screw in a state before the screw is turned to lift a semiconductor device.

FIGS. 4A and 4B are cross-sectional view showing a part provided with the above-mentioned screw. FIG. 4A shows a state before the screw is turned to lift up the semiconductor device 1, and FIG. 4B shows a state where the screw is turned to lift up the semiconductor device 1.

First, as shown in FIG. 4A, the screw 12 is screwed into a screw hole 13 extending through the printed circuit board 6 from a back surface of the printed circuit board 6 so that the screw hole 13 is arranged so that an end of the screw 12 protrudes from the mounting surface 6a of the printed circuit board 6. The screw hole 13 is provided in a mounting area where the semiconductor device 1 is mounted, and serves as a structural part used for performing a height adjustment of the semiconductor device 1. A slot 12a is provided on a rear end of the screw 12 so that the screw 12 can be turned as shown in FIG. 4B by inserting a screwdriver 24 into the slot 12a and turning the screwdriver 24. The turning of the screw 12 causes the end of the screw 12 moving upward, which results in lifting up the semiconductor device 1. Although only one screw 12 is shown in FIGS. 4A and 4B, four screws 12 are provided at positions corresponding to four corners of the semiconductor device 1 having a quadrate shape. Thus, the semiconductor device 1 can be lifted to be in parallel to the printed circuit board 6 by simultaneously turning the four screws 12. In the present embodiment, as a height-adjusting apparatus, the screwdrivers 24 and a screwdriver jig 20 are arranged on a backside of the printed circuit board 6 so as to turn the four screws 12.

Figure 5:
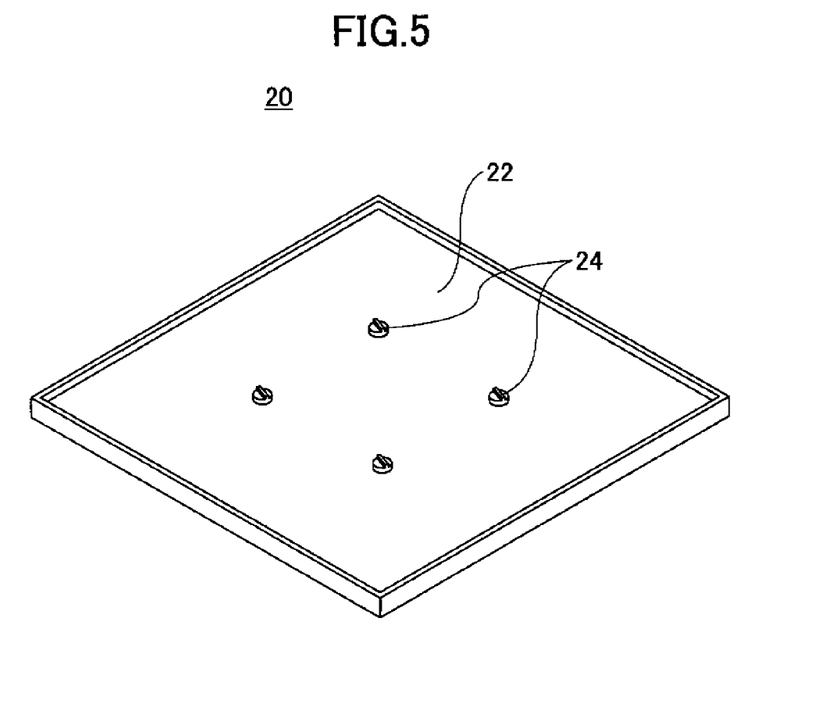
FIG. 5 is a perspective view of a screwdriver jig viewed from a front surface side.
Figure 6:
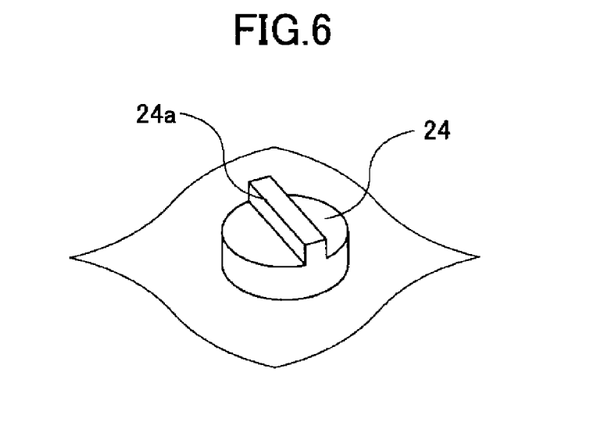
FIG. 6 is an enlarged perspective view of the screwdriver shown in FIG. 5.

A description will now be given, with reference to FIG. 5 through FIGS. 7A and 7B, of the screwdriver jig 20 as a height-adjusting apparatus. FIG. 5 is a perspective view of the screwdriver jig 20 viewed from a front surface side. FIG. 6 is an enlarged perspective view of the screwdriver 24 shown in FIG. 5.

As shown in FIG. 5, the screwdriver jig 20 has a flat plate 22 and the four screwdrivers 24 each of which is arranged to be protruded from a surface 22a of the flat plate 22. The screwdrivers 24 are that shown in FIG. 4A and FIG. 4B, and are rotatable on the flat plate 22. Each screwdriver 24 has a bit part 24a on a top surface thereof. The bit part 24a has a shape insertable into the slot 12a of the screw 12. Positions of the four screwdrivers 24 correspond to four screws 12 provided to the printed circuit board 6.

Figure 7A:
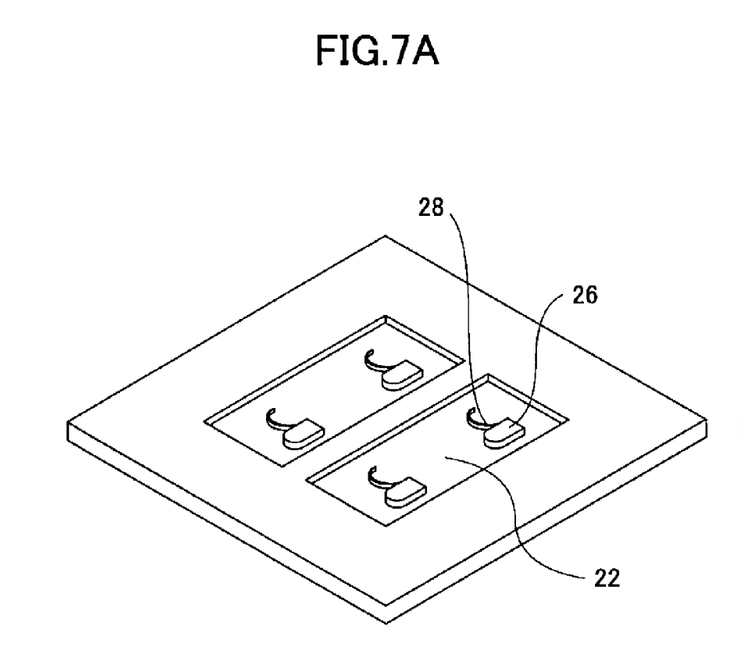
FIG. 7A is a perspective view of the screwdriver jig viewed from a backside thereof in a state before the screwdrivers 24 are turned.
Figure 7B:
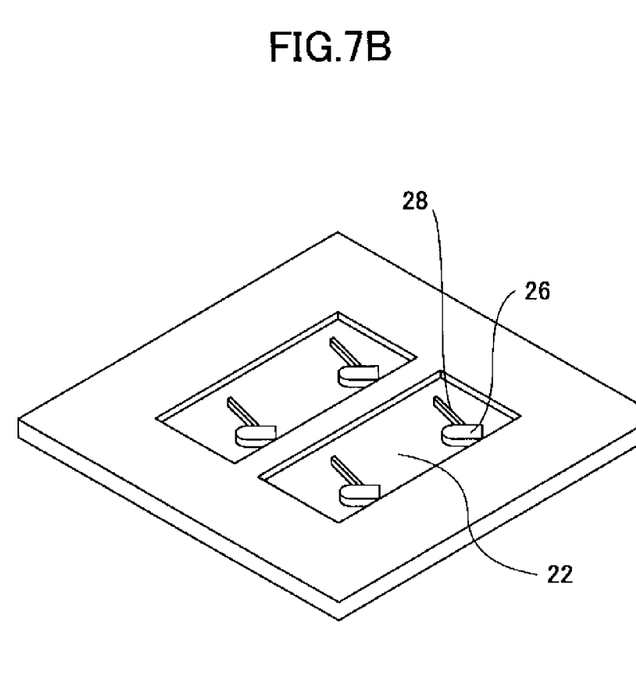
FIG. 7B is a perspective view of the screwdriver jig viewed from a backside thereof in a state after the screwdrivers are turned.

FIGS. 7A and 7B are perspective views of the screwdriver jig 20 viewed from a backside thereof. FIG. 7A shows a state before the screw river 24s are turned, and FIG. 7B shows a state after the screwdrivers 24 are turned. As shown in FIG. 7A, rotation levers 26 are attached on a back surface 22b of the flat plate 22 at positions corresponding to the respective screwdrivers 24 provided on the front surface. A shaft 26a connected to each screwdriver 24 extends through the flat plate 22 as shown in FIG. 4A and FIG. 4B. The shaft 26a is rotatably supported in a through hole formed in the flat plate 22. The screwdriver 24 can be turned through the shaft 26a by turning the rotation lever 26 arranged on the back surface 22b of the flat plate 22.

A deformable member 28 for generating a rotational movement is attached to the rotation lever 26. In the present embodiment, the deformable member 28 is formed of a shape-memory alloy that deforms when a temperature reaches a predetermined temperature (for example, a temperature of reflow). As a material that deforms at the predetermined temperature, a bimetal or the like may be used.

The deformable member 28 is a shape-memory alloy formed in an elongated belt-like shape or rod-like shape, and set in a bowed state at a room temperature as shown in FIG. 7A. The deformable member 28 is configured to be a linear shape by the bow returning to the original shape as shown in FIG. 7B when the screwdriver jig 20 is put in a reflow furnace together with the printed circuit board 6 to mount the semiconductor devices 1. An end of the deformable member 28 is fixed to a portion remote from the rotational axis of the rotation lever 26, and the other end is fixed to the flat plate 22. Accordingly, when the screwdriver jig 20 is put in a reflow furnace together with the printed circuit board 6 to mount the semiconductor devices 1, a force of each deformable member 28 to return to the original linear state is transmitted to the respective rotation lever 26, and the rotation lever 26 turns about the shaft 26a. Thereby, the screwdrivers 24 are turned, and, subsequently, the screws 12 are turned. Then, the semiconductor devices 1 are lifted up by the screws 12 by the screws 12 being turned, which increases the height of the BGA bumps 5.

That is, as the mounting process of the semiconductor device 1, first, the screwdriver jig 20 is attached to the backside of the printed circuit board 6 into which the screws 12 are screwed so as to set a state where the bit parts 24a of the ends of the screwdrivers 24 are inserted into the slots 12a of the respective screws 12. The mount of the screwdriver jig 20 is carried out at a room temperature. Then, the semiconductor devices 1 arranged at the predetermined positions of the printed circuit board 6, the printed circuit board 6, and the screwdriver jigs 20 together are put in the reflow furnace and heated.

By the heating in the reflow furnace, the BGA bumps 5 made of a thermally-meltable bonding material such as solder are melted. The melted BGA bumps 5 are set in a state where they adhere to the electrodes of the semiconductor devices 1 and the electrode pads of the printed circuit board 6. The heating in the reflow furnace is continued even after the melting temperature of the BGA bumps 5 is reached, the temperature of the deformable members 28 made of a shape-memory alloy in the rotation drive mechanism of the screwdriver jig 20 becomes equal to or higher than the transformation temperature of the shape-memory alloy, and, thereby, the bowed deformable members 28 are restored to the original linear shape. Thereby, the screwdrivers 24 are turned, and the semiconductor devices 1 are lifted up by the screws 12. At this time, the BGA bumps 5 are stretched or extended to be a predetermined height while being melted.

Thereafter, the semiconductor devices 1, the printed circuit board 6, and the screwdriver jig 20 are taken out of the reflow furnace and are cooled, which results in the BGA bumps 5 being solidified and the semiconductor devices 1 being mounted to the printed circuit board 6. Then, the screwdriver jig 20 is removed from the printed circuit board 6, and the mounting process is ended. The semiconductor devices 1 are mounted to the printed circuit board 6 in the state where they are lifted up by the screws 12, and the screws are remained in a state where they are screwed into the printed circuit board 6 and the ends thereof are in contact with the semiconductor devices 1.

As mentioned above, in the present embodiment, the semiconductor device 1 can be lifted up by a predetermined distance by turning the screws 12 incorporated in the printed circuit board 6 by attaching the screwdriver jig 20 as a height-adjusting mechanism to the printed circuit board 6, and, thereby, the height of the BGA bumps 5 can be increased. Since a shape-memory alloy is used for the rotation drive mechanism that generates a rotation force applied to the screws 12, the screws 12 can be rotated automatically by using heat of the reflow of the BGA bumps 5. Thus, the semiconductor device 1 can be lifted up automatically to increase the height of the BGA bumps 5 by the jig having a simple structure without providing a special process.

Additionally, after the screwdriver jig 20 is removed, the screws 12 remain in the state where they are screwed into the printed circuit board 6 and the ends thereof are in contact with the semiconductor device 1. Accordingly, the screws 12 serve as a standoff, which maintain the distance between the semiconductor device 1 and the printed circuit board 6. Thus, the height of the BGA bumps 5 can be maintained even if an external force is applied onto the semiconductor device 1 so that BGA bumps 5 are not compressed.

Instead of forming the deformable member 28 by a shape memory alloy, a material such as a bimetal that deforms by a temperature change may be used. Additionally, a function the same as the deformable member 28 made of a shape-memory alloy can be obtained by forming he deformable member as a straight leaf spring and the rotation lever 26 is prevented from being rotated in a state where the leaf spring is bowed previously as shown in FIG. 7A and canceling the fixation of the rotation lever 26 at an appropriate timing in the reflow process.

Although it is configured and arranged that the four corners of the semiconductor device 1 are lifted up by the four screws 12 in the above-mentioned embodiment, the number of screws 12 is not limited to 4. Additionally, the positions of the screws 12 are not limited to the positions corresponding to the four corners of the semiconductor device 1, and any positions may be used if the screws 12 can make a contact with the back surface of the semiconductor device 1.

A description will be given of a mounting board, a height-adjusting apparatus and a mounting method according to a second embodiment of the present invention.

In the mounting method according to the second embodiment of the present invention, a height-adjusting member having a step is used as the standoff 10 shown in FIG. 3. The height-adjusting member is provided movably on the surface 6a of the printed circuit board 6. The height-adjusting member is moved in a state where the BGA bumps 5 are melted when the BGA bumps 5 made of a thermally-meltable bonding material such as solder are subject to a reflow process so that a higher portion of the step of the height-adjusting member is positioned under the semiconductor device 1, which is an electronic part. Thus, the semiconductor device 1 is changed to a state where it is supported by a lower portion of the step of the height-adjusting member into a state where it is supported by the higher portion of the step. Thereby, the semiconductor device 1 is lifted up by the height-adjusting member. The distance of the lift of the semiconductor device is determined by the distance of the step of the height-adjusting member.

Figure 8A:
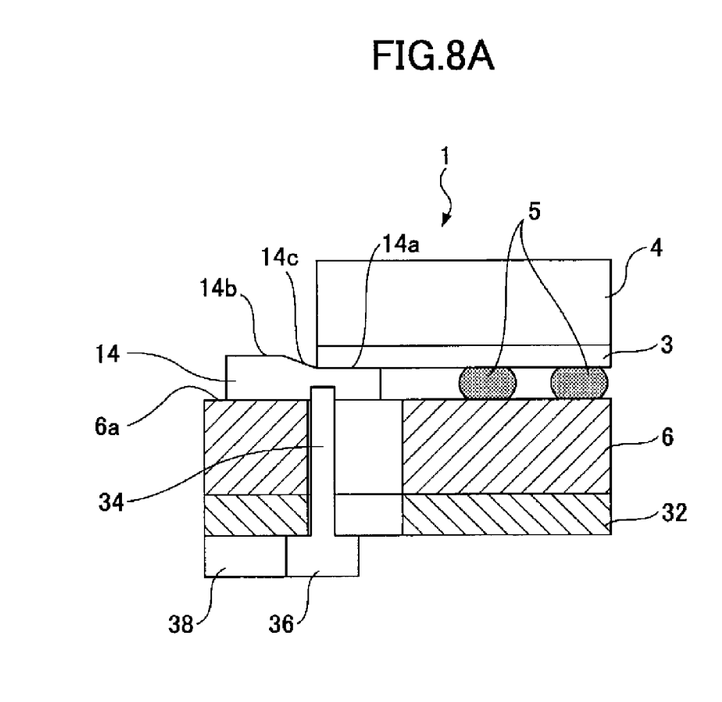
FIG. 8A is an enlarged cross-sectional views showing a portion where a height-adjusting member is provided in a state before the height-adjusting member is moved to lift up a semiconductor device 1.
Figure 8B:
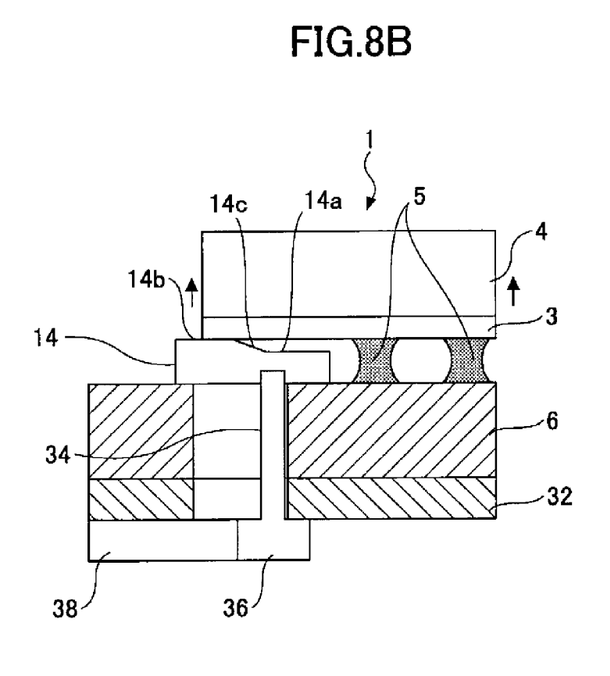
FIG. 8B is an enlarged cross-sectional views showing a portion where a height-adjusting member is provided in a state after the height-adjusting member is moved and the semiconductor device is lift up.

FIGS. 8A and 8B are enlarged cross-sectional views showing a portion where the above-mentioned height-adjusting member is provided. FIG. 8A shows a state before the height-adjusting member is moved to lift up the semiconductor device 1. FIG. 8B shows a state after the height-adjusting member is moved and the semiconductor device 1 is lift up.

Figure 9:
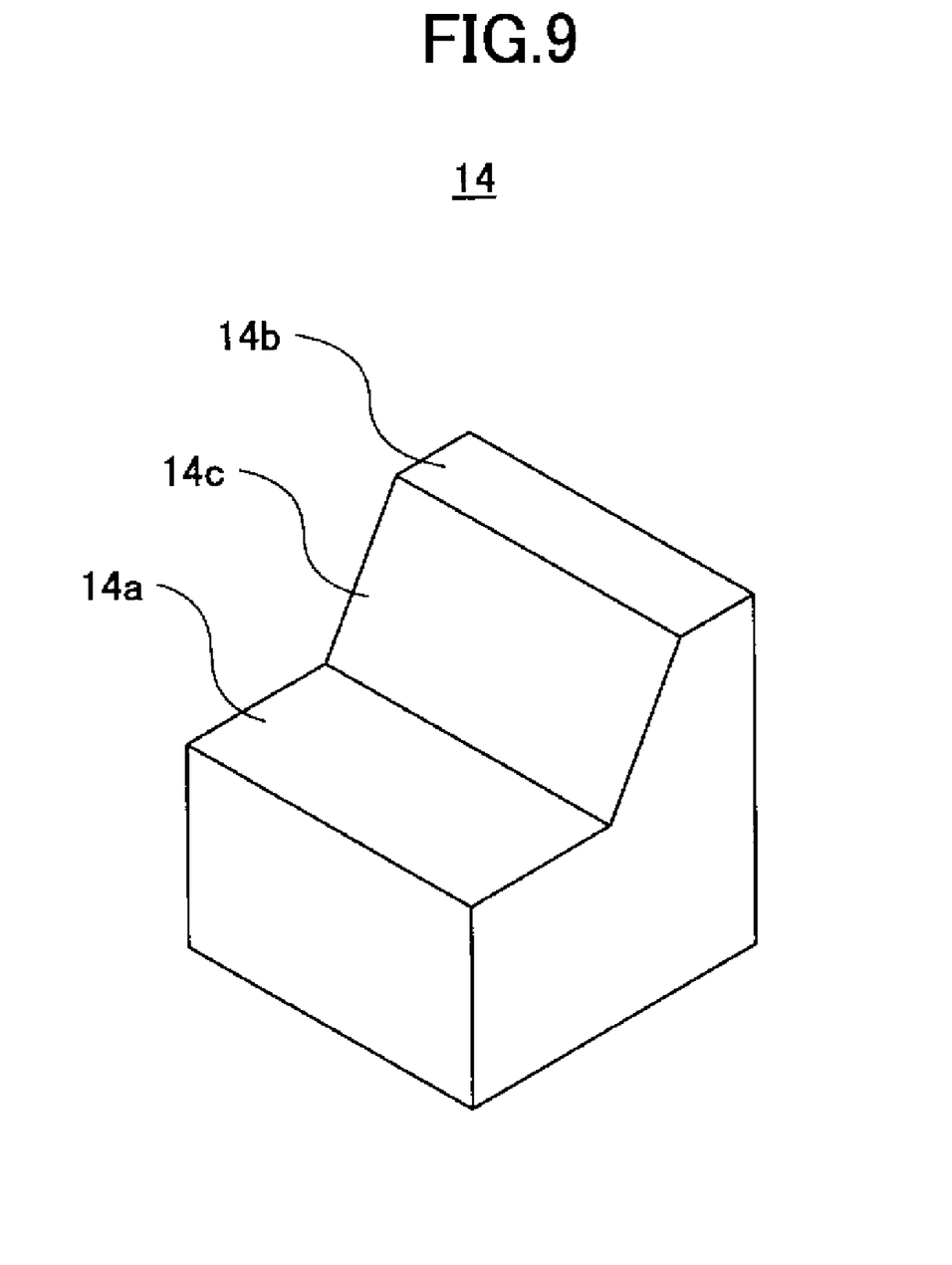
FIG. 9 is an enlarged perspective view of the height-adjusting member.

First, as shown in FIG. 8A, the height-adjusting member 14 is slidably placed on the mounting surface 6a of the printed circuit board 6. An elongated hole 6b is formed in the printed circuit board to extend through the printed circuit board 6. The height-adjusting member 14 is movable in a longitudinal direction of the elongated hole 6b by being driven by a moving lever 34 extending through the elongated hole 6b. The elongated hole 6b is provided in a mounting area where the semiconductor device 1 is provided so as to be a structural part used for performing a height adjustment of the semiconductor device 1. FIG. 9 is an enlarged perspective view of the height-adjusting member 14. The height-adjusting member 14 has the step on a top surface thereof. An oblique surface 14c is provided between a lower surface 14a and a higher surface 14c.

When the height-adjusting member 14 moves in the longitudinal direction of the elongated hole 6b, the semiconductor device 1, which has been supported by the lower surface 14a of the height-adjusting member 14 as shown in FIG. 8A, slides on the oblique surface 14c, and set in a state where it is supported by the higher surface 14b as shown in FIG. 8B. That is, the semiconductor device 1 is lifted up by the height-adjusting member 14 being moved, and is maintained in the state where the height of the BGA bumps 5 is increased. The movement of the height-adjusting member 14 is achieved by a member moving jig 30 having a member moving mechanism mentioned later. It should be noted that although four height-adjusting members 14 is arranged at positions corresponding to four corners of the semiconductor device 1, a number of the height-adjusting members 14 and positions thereof are not limited to that.

Figure 10:
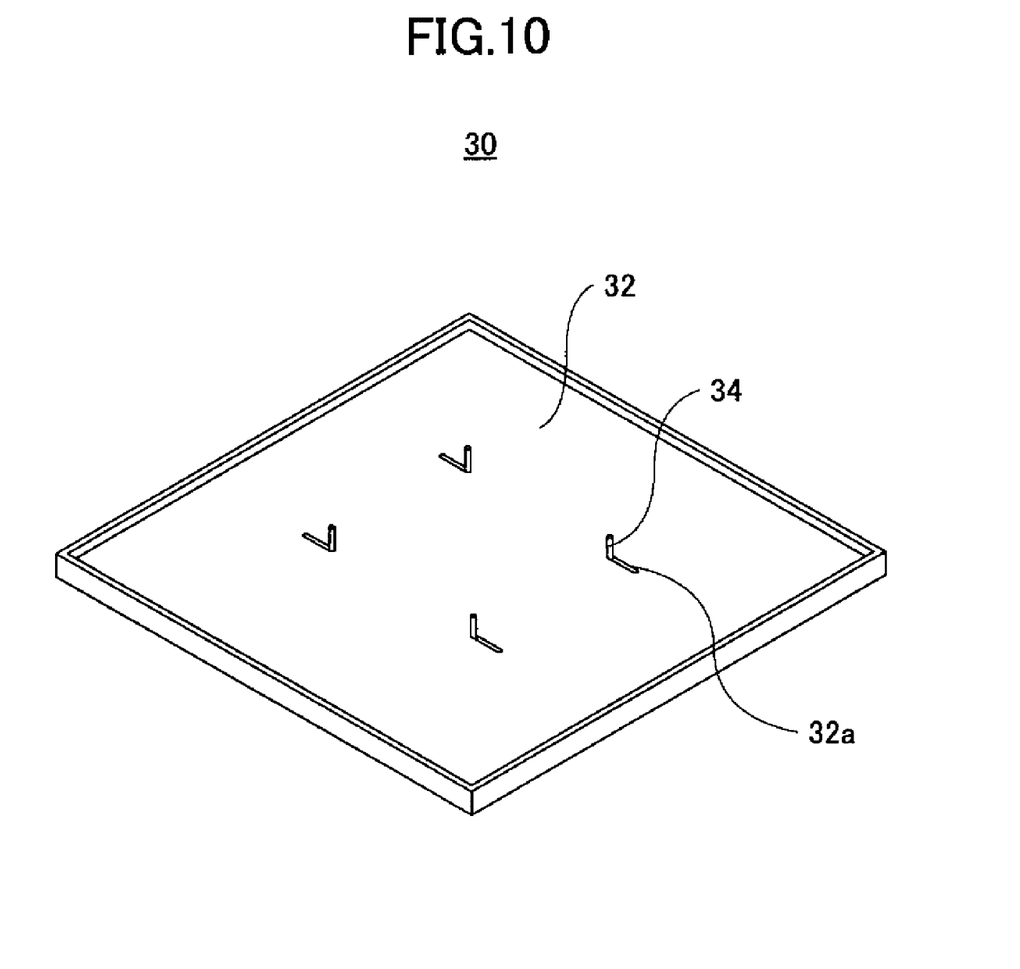
FIG. 10 is a perspective view of a member moving jig 30 viewed from a front surface side.
Figure 11A:
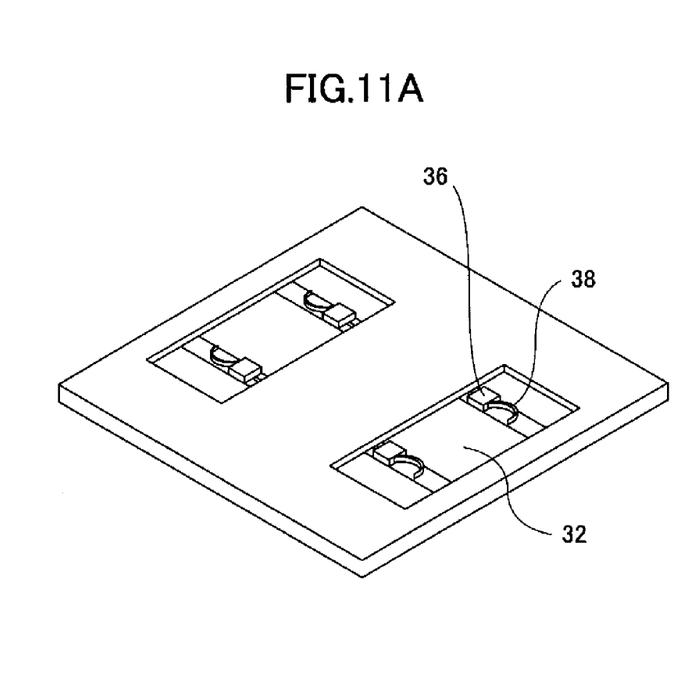
FIG. 11A is a perspective view of a member moving jig viewed from a back surface side in a state before moving moving levers.
Figure 11B:
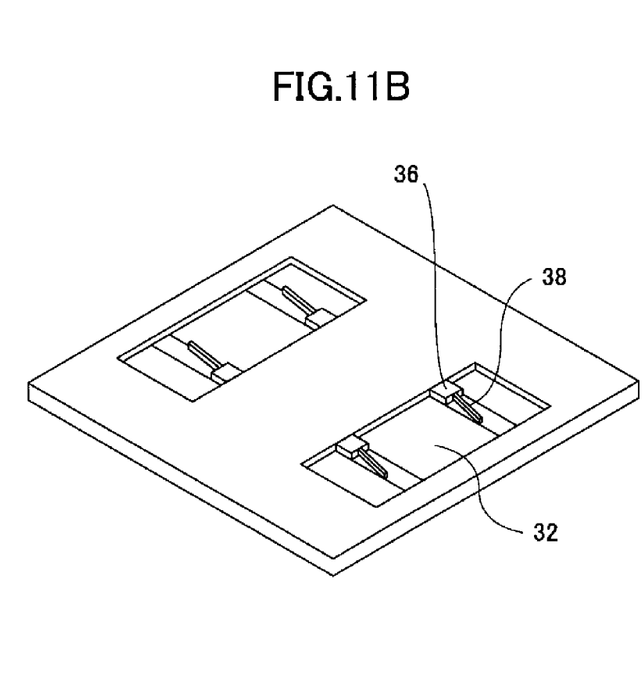
FIG. 11B is a perspective view of a member moving jig viewed from a back surface side in a state after the moving lever 34 is moved.

A description will now be given, with reference to FIG. 10 and FIGS. 11A and 11B, of the member moving jig 30 serving as a height-adjusting apparatus. FIG. 10 is a perspective view of the member moving jig 30 viewed from a front surface side. FIGS. 11A and 11B are perspective views of the member moving jig 30 viewed from a back surface side. FIG. 11A shows a state before moving the moving lever 34. FIG. 11B shows a state after the moving lever 34 is moved.

As shown in FIG. 10, the member moving jig 30 has a flat plate 32 and a moving lever 34 that is movable in a state where an end of the moving lever 34 protrudes from a surface of the flat plate 32. Four elongated holes 32a are provided in the flat plate 32 so as to align with the four elongated holes 6b of the printed circuit board 6, respectively. Each moving lever 34 as a moving member extends through the corresponding elongated hole 6 to a front surface of the flat plate 32. When the member moving jig 30 is attached to the back surface of the printed circuit board 6, the four elongated holes 32a of the flat plate 32 are aligned with the four elongated holes 6b of the printed circuit board 6, respectively, and the ends of the moving levers 34 extend through the elongated holes 6b and protrude from the mounting surface 6a of the printed circuit board 6. By the height-adjusting members 34 being connected to the moving levers 34, respectively, the height-adjusting members 14 can be moved by moving the moving levers 34.

The moving lever 34 is connected to a movable block 36 movably provided on the backside of the flat plate 32. A deformable member 38 for generating a thrust force to cause the movable block 36 to perform a linear movement is attached to the moving lever 34. In the present embodiment, the deformable member 38 is formed of a shape-memory alloy that deforms when a temperature reaches a predetermined temperature (for example, a temperature of reflow). As a material that deforms at the predetermined temperature, a bimetal or the like may be used.

The deformable member 38 is a shape-memory alloy formed in an elongated belt-like shape or rod-like shape, and set in a bowed state at a room temperature as shown in FIG. 11A. The deformable member 38 is configured to be a linear shape by the bow returning to the original shape as shown in FIG. 11B when the member moving jig 30 is put in a reflow furnace together with the printed circuit board 6 to mount the semiconductor devices 1. An end of the deformable member 38 is fixed to the movable block 36, and the other end is fixed to the flat plate 32. Accordingly, when the member moving jig 30 is put in a reflow furnace together with the printed circuit board 6 to mount the semiconductor devices 1, a force of each deformable member 38 to return to the original linear state is transmitted to the respective movable block 36. Thereby, the movable blocks 36 moves along the respective elongated holes 32a, the moving levers 34 move together with the movable blocks 36 within the respective elongated holes 32 and the respective elongated holes 6b. Thus, the height-adjusting members 14 mounted to the respective moving levers 34 are moved, and the semiconductor devices 1 are lifted up by the height-adjusting members 14, which increases the height of the BGA bumps 5.

That is, as the mounting process of the semiconductor device 1, first, the member moving jig 30 is attached to the backside of the printed circuit board 6, and the height-adjusting members 14 are attached to the ends of the moving levers 34 protruding from the mounting surface 6a of the printed circuit board 6. The height-adjusting members 14 are attached so that bottom surfaces thereof are brought into contact with the mounting surface of the printed circuit board 6. Then, the semiconductor devices 1 to be mounted are placed on the lower surfaces 14a of the height-adjusting member 14. The attachment of the member moving jig 30 is carried out at a room temperature. Then, the semiconductor devices 1 placed on the lower surfaces 14a of the height-adjusting members 14, the printed circuit board 6, and the member moving jig 30 attached to the printed circuit board 6 together are put in the reflow furnace and heated.

By the heating in the reflow furnace, the BGA bumps 5 made of a thermally-meltable bonding material such as solder are melted. The melted BGA bumps 5 are set in a state where they adhere to the electrodes of the semiconductor devices 1 and the electrode pads of the printed circuit board 6. When the heating in the reflow furnace is continued even after the melting temperature of the BGA bumps 5 is reached, the temperature of the deformable members 38 made of a shape-memory alloy in the moving mechanism of the member moving jig 30 becomes equal to or higher than the transformation temperature of the shape-memory alloy, and, thereby, the bowed deformable members 38 are restored to the original linear shape. Thereby, the movable blocks 36 are moved, and the moving levers 34 and the height-adjusting members 14 attached to the movable blocks 36 are moved. Since the height-adjusting members 14 move in a direction toward the respective semiconductor devices 1, the semiconductor devices 1 override the higher surfaces 14b of the respective height-adjusting members 14 by sliding on the oblique surfaces 14b. That is, the semiconductor devices 1 are lifted up by the height-adjusting members 14. At this time, the BGA bumps 5 are stretched or extended to be a predetermined height while being melted.

Thereafter, the semiconductor devices 1, the printed circuit board 6 and the member moving jig 30 are taken out of the reflow furnace and are cooled, which results in the BGA bumps 5 being solidified and the semiconductor devices 1 being mounted to the printed circuit board 6. Then, the member moving jig 30 is removed from the printed circuit board 6, and the mounting process is ended. The semiconductor devices 1 are mounted to the printed circuit board 6 in the state where they are lifted up by the height-adjusting members 14, and the height-adjusting members 14 are remained in a state where they are sandwiched between the printed circuit board 6 and the semiconductor devices 1.

As mentioned above, in the present embodiment, the semiconductor device 1 can be lifted up by a predetermined distance by moving the height-adjusting member 14 provided to the printed circuit board 6 by attaching the member moving jig 30 to the printed circuit board 6, and, thereby, the height of the BGA bumps 5 can be increased. Since a shape-memory alloy is used for the drive mechanism that generates a force applied to the height-adjusting member 14, the height-adjusting member 14 can be moved automatically by using heat of the reflow of the BGA bumps 5. Thus, the semiconductor device 1 can be lifted up automatically to increase the height of the BGA bumps 5 by the jig having a simple structure without providing a special process.

Additionally, after the member moving jig 30 is removed, the height-adjusting members 14 remain between the printed circuit board 6 and the semiconductor devices 1 in the state where they are in contact with the semiconductor devices 1. Accordingly, the height-adjusting member 14 serves as a standoff, which maintain the distance between the semiconductor device 1 and the printed circuit board 6. Thus, the height of the BGA bumps 5 can be maintained even if an external force is applied onto the semiconductor device 1 so that BGA bumps 5 are not compressed.

Instead of forming the deformable member 38 by a shape memory alloy, a material such as a bimetal that deforms by a temperature change may be used. Additionally, a function the same as the deformable member 38 made of a shape-memory alloy can be obtained by forming he deformable member 38 as a straight leaf spring and the movable block 38 is prevented from being moved in a state where the leaf spring is bowed previously as shown in FIG. 11A and canceling the fixation of the movable block 36 at an appropriate timing in the reflow process.

Although it is configured and arranged that the four corners of the semiconductor device 1 are lifted up by the four height-adjusting members 14 in the above-mentioned embodiment, the number of the height-adjusting members 14 is not limited to 4. Additionally, the positions of the height-adjusting members 14 are not limited to the positions corresponding to the four corners of the semiconductor device 1, and any positions may be used if the height-adjusting member 14 can make a contact with the back surface of the semiconductor device 1.

A description will now be given of a mounting board, a height-adjusting apparatus and a mounting method according to a third embodiment of the present invention.

In the mounting method according to the third embodiment of the present invention, a spacer block 16 is used as the standoff 10 shown in FIG. 3. The spacer block 16 is moved in a state where the BGA bumps 5 are melted when the BGA bumps 5 made of a thermally-meltable bonding material such as solder are subject to a reflow process so that the spacer block is positioned under the semiconductor device 1, which is an electronic part. In the present embodiment, a height-adjusting mechanism configured to lift up the semiconductor device in a reflow process separate from the spacer block 16*a*. The spacer block 16 is moved to a position under the semiconductor device 1 in the state where the semiconductor device 1 is lifted up by the height-adjusting mechanism. Thereafter, semiconductor device 1 is supported by the space block 16 even after the height-adjusting mechanism is removed from the semiconductor device 1. Thus, the state where the semiconductor device 1 is lifted up and the height of the BGA bumps 5 is increased is maintained. The distance of the lift of the semiconductor device 1 is determined by the height of the spacer block 16.

Figure 12A:
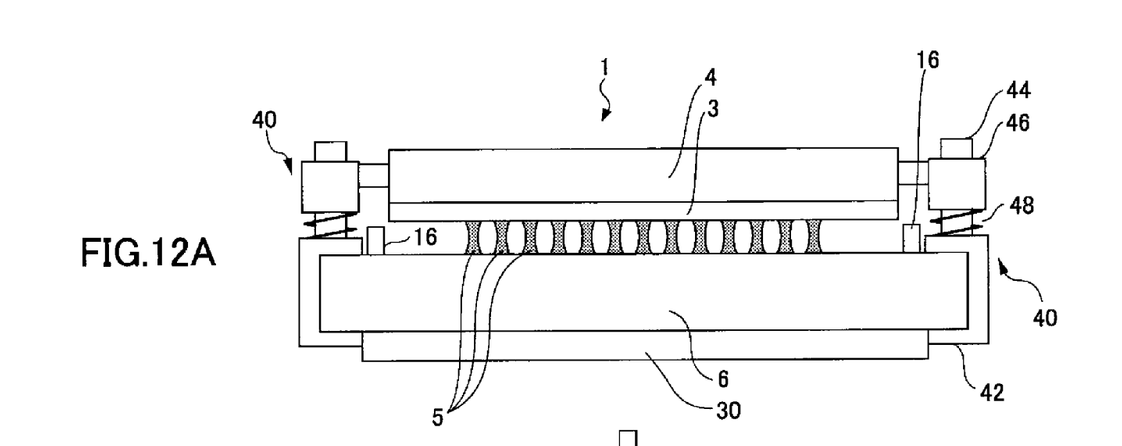
FIG. 12A is a side view showing a state where a height-adjusting jig having a height-adjusting mechanism is attached to a printed circuit board and before the semiconductor device 1 is lifted up by the height-adjusting jig.
Figure 12B:
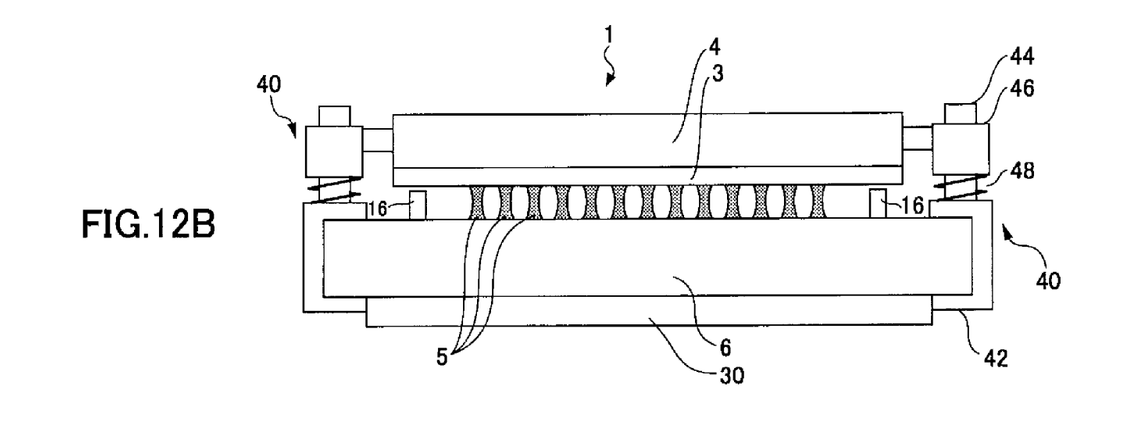
FIG. 12B is a side view showing a state where a height-adjusting jig having a height-adjusting mechanism is attached to a printed circuit board and after spacer blocks are moved to a position under the lifted semiconductor device 1.

FIGS. 12A and 12B are side views showing a state where a height-adjusting jig having the above-mentioned height-adjusting mechanism is attached to the printed circuit board. FIG. 12A shows a state before the semiconductor device 1 is lifted up by the height-adjusting jig. FIG. 12B shows a state after the spacer block 16 is moved to a position under the lifted semiconductor device 1.

The height-adjusting jig 40 is attached to the printed circuit board 6 so as to lift up the semiconductor device 1 in a reflow process of the BGA bumps 5. The height-adjusting jig 40 includes clamp parts 42 that clamp the printed circuit board 6, support columns 44 extending upward from the clamp parts 42, and arm parts 46 movable along the support columns 44. A spring 48 as a deformable member made of a shape-memory alloy is provided between each arm part 46 and the respective clamp part 42. An end of each arm part 42 engages with a side surface of the semiconductor device 1.

The spring 48 is a coil spring made of a shape-memory alloy that is set to stretch or extend by a predetermined distance by heat of a reflow process of the BGA bumps 5. FIG. 12A shows a state where the springs 48 are stretched and the semiconductor device 1 is lifted up in a reflow process. Before the semiconductor device 1 is lifted up, the spacer blocks 16 are arranged around the semiconductor device 1. After the semiconductor device 1 is lifted up to a position above top surfaces of the spacer blocks 16, the spacer blocks 16 are moved to positions under the semiconductor device 1. The mechanism to move the spacer blocks 16 is the same as the member moving jig 30 used in the above-mentioned second embodiment. That is, the height-adjusting member 14 shown in FIGS. 8A and 8B is replaced by the spacer block 16, and the spacer block 16 may be attached to an end of the moving lever 34. The mechanism to move the moving lever 34 is constituted by the movable block 36 and the deformable member 38 such as shown in FIGS. 11A and 11B. Accordingly, in the present embodiment, the height-adjusting apparatus is constituted by the height-adjusting jig 40 and the member moving jig 30.

In the present embodiment, the semiconductor device 1 must be lifted up before moving the spacer blocks 16. Thus, deformation of the springs 48 of the height-adjusting jig 40 used as a lift-up mechanism must occur faster than the deformation of the deformable members 38 of the member moving jig 30. Accordingly, for example, if the springs 48 and the deformable members 38 are made of a shape-memory alloy, the transformation temperature of the springs 48 is set slightly lower than the transformation temperature of the deformable members 36.

As the mounting process of the semiconductor device 1, first, the member moving jig 30 is attached to the backside of the printed circuit board 6, and the spacer blocks 16 are attached to the ends of the moving levers 34 protruding from the mounting surface 6*a* of the printed circuit board 6. The spacer blocks 16 are attached so that bottom surfaces thereof are brought into contact with the mounting surface of the printed circuit board 6 and slidable on the printed circuit board 6. Then, the height-adjusting jig 40 is attached to the printed circuit board 6, and the semiconductor device is supported by the arm parts 46. The attachment of the member moving jig 30 and the height-adjusting jig 40 is carried out at a room temperature. Then, the semiconductor device 1 supported by the height-adjusting jig 40, the printed circuit board 6, and the member moving jig 30 attached to the printed circuit board 6 together are put in the reflow furnace and heated.

By the heating in the reflow furnace, the BGA bumps 5 made of a thermally-meltable bonding material such as solder are melted. The melted BGA bumps 5 are set in a state where they adhere to the electrodes of the semiconductor devices 1 and the electrode pads of the printed circuit board 6. Here, the temperature of the springs 48 of the height-adjusting jig 40 reaches the transformation temperature and the springs 48 expand. Thereby, the arm parts 46 move upward, and the semiconductor device 1 supported by the arm parts 46 is lifted up, which results in the BGA bumps 5 being stretched or elongated while being melted. When the heating in the reflow furnace is continued even after the arm parts move upward, the temperature of the deformable members 38 made of a shape-memory alloy in the moving mechanism of the member moving jig 30 becomes equal to or higher than the transformation temperature of the shape-memory alloy, and, thereby, the bowed deformable members 38 are restored to the original linear shape. Thereby, the movable blocks 36 are moved, and the spacer blocks 16 are moved together with the moving levers 34 attached to the movable blocks 36. The spacer blocks 16 move toward an inner part of the semiconductor device 1 to positions under the semiconductor device 1.

Thereafter, the semiconductor devices 1, the printed circuit board 6, the member moving jig 30 and the height-adjusting jig 40 are taken out of the reflow furnace and are cooled, which results in the BGA bumps 5 being solidified and the semiconductor devices 1 being mounted to the printed circuit board 6. Then, the member moving jig 30 and the height-adjusting jig 40 are removed from the printed circuit board 6, and the mounting process is ended. The semiconductor devices 1 are mounted to the printed circuit board 6 in the state where they are lifted up by the height-adjusting jig 40, and the spacer blocks 16 are remained in a state where they are sandwiched between the printed circuit board 6 and the semiconductor devices 1.

As mentioned above, in the present embodiment, the semiconductor devices 1 can be lifted up by a predetermined distance by moving the spacer blocks 16 provided to the printed circuit board 6 by attaching the height-adjusting jig 40 to the printed circuit board 6, and, thereby, the height of the BGA bumps 5 can be increased. Since a shape-memory alloy is used for the drive mechanism that generates a force applied to the arm parts 46, the semiconductor devices 1 can be lifted up automatically by using heat of the reflow of the BGA bumps 5. Thus, the semiconductor devices 1 can be lifted up automatically to increase the height of the BGA bumps 5 by the jig having a simple structure without providing a special process.

Additionally, the spacer blocks 16 can be moved by the member moving jig 30 by the heat of the reflow process, the spacer blocks 16 can be positioned under the semiconductor devices 1 with a jig having a simple structure without providing a special process. After the member moving jig 30 is removed, the spacer blocks 16 remain between the printed circuit board 6 and the semiconductor device 1 in the state where they are in contact with the semiconductor devices 1. Accordingly, the spacer block 16 serves as a standoff, which maintains the distance between the semiconductor devices 1 and the printed circuit board 6. Thus, the height of the BGA bumps 5 can be maintained even if an external force is applied onto the semiconductor device 1 so that BGA bumps 5 are not compressed.

The present invention is not limited to the specifically disclosed embodiments, and variations and modifications may be made without departing from the scope of the present invention.

The present application is based on Japanese priority application filed Dec. 26, 2006, the entire contents of which are hereby incorporated herein by reference.

What is claimed is:

1. A mounting board onto which an electronic part having mounting terminals made of a thermally-meltable bonding material is mounted, the mounting board comprising:
   a structural part used for moving a height-adjusting member to a position under said electronic part in a process of heating and melting the thermally-meltable bonding material so as to maintain a predetermined distance between the electronic part and the mounting board,
   wherein said structural part includes:
   a screw;
   a screw driver engaged with said screw to rotate said screw;
   a rotation member engaged with said screw driver to rotate said screw driver; and
   a deformable member that generates a force to rotate said rotation member by deformation, wherein the deformable member is formed of a material deforming due to heat when reflowing said mounting terminals of said electronic part.

2. The mounting board as claimed in claim 1, wherein said structural part includes a screw hole extending through said mounting board in a mounting area of said electronic part so that said screw screwed into the screw hole serves as said height-adjusting member.

3. A height-adjusting apparatus configured to be attached to a mounting board onto which an electronic part having mounting terminals made of a thermally-meltable bonding material is mounted, the mounting board having a screw hole extending therethrough and a screw as a height-adjusting member being screwed into the screw hole, the height-adjusting apparatus comprising:
   a screw driver configured to be engaged with said screw of said mounting board;
   a rotation member being engaged with said screw driver to rotate said screw driver; and
   a deformable member that generates a force to rotate said rotation member by deformation, wherein the deformable member is formed of a material deforming due to heat when reflowing said mounting terminals of said electronic part.

4. The height-adjusting apparatus as claimed in claim 3, wherein said deformable member is formed of a shape-memory alloy that deforms at a heating temperature of reflow of said mounting terminals of said electronic part.

5. The height-adjusting apparatus as claimed in claim 3, wherein said structural part includes an elongated hole extending through said mounting board in a mounting area of said electronic part so that said height-adjusting member is connected to a moving member that is arranged to extend through the elongated hole, and wherein said deformable member generates a thrust force to move the moving member in an extending direction of the elongated hole by being deformed.

6. The height-adjusting apparatus as claimed in claim 5, wherein a top surface of said height-adjusting member is provided with a step formed by a higher surface and a lower surface, and the higher surface and the lower surface are connected by an oblique surface.

7. The height-adjusting apparatus as claimed in claim 5, further comprising a lifting mechanism that lifts said electronic part by a member deforming by heating of said reflowing while supporting said electronic part.

* * * * *